United States Patent [19]

Baumgartner et al.

[11] Patent Number: 5,290,597

[45] Date of Patent: Mar. 1, 1994

[54] METHOD OF TREATING HALOGENATED POLYIMIDE SUBSTRATES FOR INCREASING ADHESION OF METAL LAYER THEREON

[75] Inventors: Charles E. Baumgartner, Schenectady, N.Y.; Lisa R. Scott, Chicago, Ill.

[73] Assignee: General Electric Company, Schenectady, N.Y.

[21] Appl. No.: 874,448

[22] Filed: Apr. 27, 1992

[51] Int. Cl.$^5$ ............................................. B05D 1/00
[52] U.S. Cl. ............................... 427/306; 427/305; 427/443.1; 205/187; 205/211
[58] Field of Search ............... 427/306, 305, 443.1; 205/187, 211

[56] References Cited

U.S. PATENT DOCUMENTS

| | | |
|---|---|---|
| 3,011,920 | 12/1961 | Shipley, Jr. . |
| 3,841,881 | 10/1974 | Feldstein et al. . |
| 4,111,906 | 9/1978 | Jones et al. . |
| 4,203,922 | 5/1980 | Jones et al. . |
| 4,425,380 | 1/1984 | Nuzzi ............................... 427/307 |
| 4,515,829 | 5/1985 | Decker et al. . |
| 4,555,315 | 11/1985 | Barbieri et al. . |
| 4,842,946 | 6/1989 | Foust ................................. 427/306 |
| 4,931,310 | 6/1990 | Anschel ............................. 427/306 |
| 5,130,192 | 7/1992 | Takabayashi ...................... 427/306 |
| 5,178,914 | 1/1993 | Goldblatt ........................... 427/306 |
| 5,183,692 | 2/1993 | Mukerji ............................. 427/306 |

FOREIGN PATENT DOCUMENTS

| | | |
|---|---|---|
| 990593 | 6/1976 | Canada ............................... 427/306 |
| 0272420 | 11/1987 | France . |

OTHER PUBLICATIONS

Kirk-Othmer, Encyclopedia of Chemical Technology, Third Edition, vol. 8-Wiley-Interscience-Wayne A. McRae, Research Ionics, Ind.-Electroless Plating-pp. 738-750.

Kirk-Othmer, Encyclopedia of Chemical Technology, Third Edition, vol. 8-Wiley-Interscience-Nikolaus E. Wolff, Consultant, Hanover, N.H., John W. Weigl, Xerox Corp.-Electroplating-pp. 826-869.

E. I. Monthly No: E18907061713, Thermal Properties of EYMYD Polyimides, R. J. Jones, and E.M. Silvermann-TRW Space & Technology Group, Redondo Beach, Calif.-SAMPE Journal v 25 n 2, Mar.-Apr. 1989, pp. 41-44.

Primary Examiner—Shrive Beck
Assistant Examiner—Vi Duong Dang
Attorney, Agent, or Firm—William H. Pittman

[57] ABSTRACT

Method of producing a polyimide layer having improved adhesion to a metal layer thereon. A halogenated polyamic acid is sprayed, partially cured, degreased and oxidized to form a partially cured polyimide layer, which is then electrolessly plated with a primary metal layer and then final cured into the polyimide layer. Electrolessly or electrolytically applied secondary metal layers are then deposited on the primary layer, until the metal layer of a desired thickness is attained. The present invention further discloses articles such as an EMI shielded enclosure and an insulated mold surface, having metal layers as an EMI shield and an insulating surface, respectively.

20 Claims, No Drawings

METHOD OF TREATING HALOGENATED POLYIMIDE SUBSTRATES FOR INCREASING ADHESION OF METAL LAYER THEREON

CROSS REFERENCE TO RELATED APPLICATIONS

Reference is made to a commonly assigned copending application Ser. No. 07/765,801 filed on Sep. 26, 1991 for Method of Treating Halogenated Polyimide Substrates and Articles Obtained Therefrom, and to commonly assigned concurrently filed applications for Method of Producing Modified Polyimide Layer Having Improved Adhesion To Metal Layer Thereon, Ser. No. 07/874,153 and Halogenated Polyimide Composition Having Improved Adhesion Characteristic and Articles Obtained Therefrom, Ser. No. 07/874,453, all incorporated herein by reference.

FIELD OF THE INVENTION

The present invention is directed to improved methods of plating metal on a polyimide surface, and particularly to improvements in the adhesion of metal layers on halogenated polyimide surfaces.

BACKGROUND OF THE INVENTION

One aspect of the present invention is directed to an insulation layer used in plastic molding applications. Recent improvements in the molding of plastic parts include providing a multilayer composite mold structure in which a thermally conductive core or a cavity, e.g., a metal core or cavity, is covered with an insulating layer, generally of a polymer, over which a hard skin metal layer is provided for improving the surface characteristics of a molded article made from such a mold structure. The purpose of the insulating layer is to slow the cooling of the thermoplastic material sufficiently so that heat from the plastic material remains within the polymer melt for a period of time sufficient to prevent formation of voids, die lines, folds and other surface defects created during the solidification of the plastic melt. Otherwise, the plastic material which comes in contact with the relatively cool surface of the mold core, quickly solidifies and the surface defects are frozen in place on the molded article surface. Such an insulating layer is sometimes also known as a thermally engineered multilayered insulated structure (TEMIS) mold surface.

The present invention recognizes a problem that exits in injection molding processes employing thermal insulation layers of the type discussed above. In particular, where a metal skin is employed over the insulation layer to improve the surface characteristics of a finished article, delamination may occur at the interface of the metal skin and the underlying insulation layer, especially near areas adjacent to the gate through which molten polymer is injected into the mold cavity. The present invention is directed to improving the adhesion of the metal skin to the underlying insulation layer.

Another aspect of the present invention is directed to metallized polymer substrates used in various industries. Ever since structural plastics have replaced metal in the enclosures used in electrical appliances, microwave ovens, business machines, and other electrical/electronic products, manufacturers have had to overcome problems caused by electromagnetic interference (EMI) in general and radio frequency interference (RFI) in particular. The Federal Communications Commission (FCC), since 1983, requires that the electrical products not exceed certain specified EMI/RFI levels. The FCC requirements have been codified in the FCC regulation CRF 47 Part 15, Subsection J. The FCC requirements are met by reducing the EMI/RFI emission from the electrical/electronic products by providing a shielding. With the increased sensitivity of newer, higher-speed, and higher-frequency circuits plus a continued proliferation of electronic devices worldwide, EMI shielding problems are becoming more demanding. This has placed greater emphasis on high signal attenuation by the shielding medium.

The EMI shielded enclosures are also used to protect delicate electronic/electrical circuitry and components enclosed within the enclosure from damage by external sources such as static electricity or man-made high intensity EMI emissions.

Enclosures having metal cases, metal foil claddings, wire mesh screens, applied coatings, magnetic materials, and a variety of alternative approaches have been tried. However, because of their cost advantages and superior performance, plastic enclosures having metallized coatings have emerged as the dominant choice.

Several attempts have been made to increase the adhesion of a conductive metal layer to halogenated polyimide substrates. One of the prior art methods for improving adhesion involves grit blasting the surface to provide a roughened profile on which the subsequently-applied metals can be anchored. Other methods call for the use of chemical swelling agents or penetrants to swell the surface prior to the application of a metal layer.

While such methods do increase adhesion, they are often not entirely satisfactory for several reasons. Such techniques often result in physical degradation of the halogenated polyimide surface thereby decreasing the tensile as well the impact strength of the underlying halogenated polyimide substrate. The aforementioned physical degradation results from the swelling and cracking steps to which the entire substrate material is exposed. Additionally, such surface preparations can cause crack formation and propagation at highly stressed areas such as at sharp corners or edges of the enclosure being shielded.

SUMMARY OF THE INVENTION

The present invention is directed to a method of metallizing a halogenated polyimide layer comprising, applying a coating of a halogenated polyamic acid over the surface of a substrate, partially curing the coating into a partially cured halogenated polyimide layer, treating the surface of the partially cured halogenated polyimide layer with a degreasing agent, treating the degreased surface with an oxidizing agent, applying a primary metal layer on the oxidized surface, final curing the partially cured polyimide layer into the halogenated polyimide layer, and applying a secondary metal layer on the primary metal layer.

The present invention further includes articles such as an insulated mold surface and an EMI shielded enclosure having metal layers as an insulating surface and an EMI shield, respectively.

DETAILED DESCRIPTION OF THE PREFERRED EMBODIMENT

The present invention is directed to a method of preparing a halogenated polyimide surface having improved adhesion to a metal layer deposited on the surface. Generally an adhesive bond between the metal layer and the surface of the underlying substrate is established by interfacial molecular contact between the metal layer and the surface.

The polymeric surface used in the present invention is of a halogenated polyimide. A fluorinated polyimide is preferred. The term "surface" or "halogenated polyimide surface" means a surface of a halogenated polyimide substrate that may be in the form of an article such an insulated mold surface or an EMI shielded enclosure.

The halogenated polyimide suitable for the method of the present invention is a partially halogenated polyamic acid known in the art. A typical structure of a known partially halogenated polyamic acid is as follows:

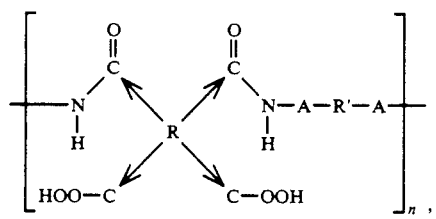

where R' is a halogenated alkyl group, A is a substituted or unsubstituted phenylene or diphenyl ether group, and R is an organic group of 5 to 50 carbon atoms. The organic group R may be an unsubstituted or halogen substituted aliphatic, alicyclic, aromatic, heteroaliphatic, heteroalicyclic, heteroaromatic radical or combinations thereof. The aforementioned hetero radical of the organic group R contains oxygen or oxygen and sulfur atoms and the aromatic or the heteroaromatic radical has one or more benzene or fused polynuclear rings and the halogenated alkyl group R' is preferably fluorinated. The organic group R having an aromatic radical is preferred. The arrows on the bonds of the organic group R signify that the aforementioned polyamic acid structure includes its various positional isomers.

A most preferred embodiment of the partially halogenated polyamic acid includes the product of a condensation reaction of substantially equal molar amounts of aromatic dianhydride and aromatic diamine. More specifically 2,2-bis[4-(4-aminophenoxy)phenyl]hexafluoropropane, a four ring aromatic diamine designated as 4-BDAF having the following structure:

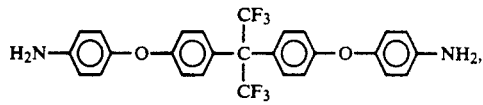

is reacted at a 1:1 stoichiometry with pyromellitic dianhydride (PMDA) to form a partially fluorinated precursor resin commercially designated as L-30N resin, having the following structure,

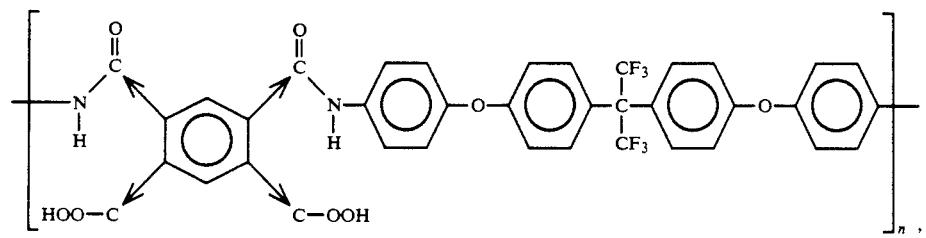

where n is an integer sufficient to provide a structure having an average molecular weight of at least 5000.

Another partially halogenated polyamic acid suitable for use in the present invention is prepared when 4-BDAF is reacted at a 1:1 stoichiometry with benzophenone tetracarboxylic acid dianhydride (BTDA) to form a partially fluorinated polyamic acid commercially designated as L-20N resin having the structure of,

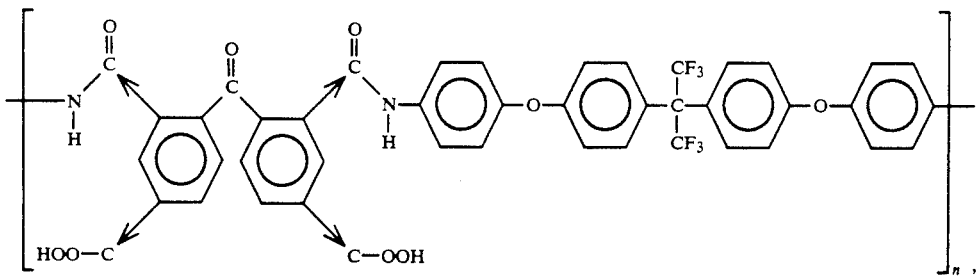

where n is an integer sufficient to provide a structure having an average molecular weight of at least 5000.

Both L-30N and L-20N precursor resins are manufactured by Ethyl Corporation under the trademark EYMYD®. The aforementioned EYMYD® polyimide resins are described more fully in U.S. Pat. Nos. 4,111,906 and 4,203,922, both of which are incorporated herein by reference. The EYMYD® resin is a polyamic acid precursor in a 1-methyl-2-pyrrolidinone (NMP) solvent and is a brown, varnish-like solution. Solvent evaporation and curing of the polyamic acid results in formation of a fluorine containing polyimide. Applying the EYMYD® resin to a surface followed by solvent removal and curing produces a high quality polyimide coating with an excellent thermal and oxidative stability, adhesion, and frictional wear. Reference is also made to SAMPE Journal, pages 41–44, Volume 25, No. 2, March/April 1989 for a further description of the EYMYD ® polyimides.

The aforementioned halogenated polyimides may contain various amounts of fillers or reinforcing agents such as talc, mica, aluminum silicate, zinc oxide, titanium dioxide, carbon black, glass fibers, glass spheres, carbon fibers and mixtures thereof. In addition to the aforementioned fillers, the halogenated polyimides also can contain additional additives such as pigments, ultraviolet radiation absorbing agents, impact modifiers, plasticizers, microwave absorbing agents, stabilizers, processing aids, and anti-static agents.

The halogenated polyimide layer of the most preferred embodiment is derived by curing the L-30N EYMYD ® precursor resin.

The halogenated polyamic acid may be diluted to a sprayable solution suitable for spray coating on the surface of a suitable substrate, by adding one part of the reaction product to 4 parts of a solvent solution containing a mix of about 95% by weight of MEK (methylethylketone) with about 5% by weight of NMP. A coating of the halogenated polyamic acid can be disposed on the surfaces of desired substrates, such as those of polyimide and epoxy resins as well as other materials, such as carbon fibers, graphite, aluminum, copper, titanium, INCONEL, steel, nickel, chromium and glass.

The sprayable solution is generally sprayed on the surface of the substrate maintained at about 80° C. to about 150° C., preferably at about 104° C. It should be noted that most of the MEK solvent is evaporated at this stage. The temperature of the coating of the polyamic acid is increased at a steady rate (ramped) from the aforementioned spray temperature to a partial cure temperature of about 205° C. to 250° C. in about 1 to about 4 hours, preferably about 240° C. in about 2 hours. It should be noted that most of the NMP solvent is evaporated at this stage.

The solvent free halogenated polyamic acid coating is then partially cured at the aforementioned partial cure temperature for about 30 minutes to about 2 hours, preferably for about one hour into a partially cured halogenated polyimide layer. It is believed that during this partial curing stage about 95% to about 98% of the halogenated polyamic acid is imidized. When polyamic acid is subjected to heat, the carboxylic and amide groups present in each of its unit react and lose water. As a result, polyamic acid is converted into its imidized form.

After the aforementioned partial curing step, the partially cured halogenated polyimide layer can be degreased with a conventional environmentally safe degreasing agent such as detergent, or a suitable organic solvent. As used thereinafter, the term "degreased" means a partially cured halogenated polyimide substrate having its surface free of oil, molding compounds, finger prints or extraneous material.

After the partially cured halogenated polyimide surface is degreased, it is subjected to an oxidation step. The surface is oxidized for effective time and at effective temperature with an oxidizing agent of effective concentration. During the aforementioned oxidation step, the partially cured halogenated polyimide surface is treated by immersion, spraying, painting, or other forms of surface treatment with the oxidizing agent. Typical oxidizing agents used in the present invention include aqueous solutions of alkali metal dichromate and sulfuric acid, of ammonium dichromate and sulfuric acid, of alkali metal permanganate and alkali metal hydroxide, of cerium sulfate and sulfuric acid and of hydrogen peroxide.

In the preferred embodiment of the present invention, the surface of the degreased partially cured halogenated polyimide layer is immersed in an aqueous solution of an alkali metal hydroxide an alkali metal permanganate at a temperature of about 25° C. to 85° C., preferably at about 40° C., for a period of 2 to 20 minutes, preferably at about 2.5 minutes. The permanganate oxidizing solution can contain from about 1 gram to 30 grams of potassium permanganate per liter of solution, preferably about 3 grams to about 5 grams per liter, and about 3 grams to about 60 grams of sodium hydroxide per liter of solution, preferably about 5 grams to about 10 grams per liter. For effective results the substrate can then be removed from the bath for a water rinse. The rinse can be effected by immersing the treated substrate in water, or by spraying or brushing. The alkali metal permanganate preferably is potassium or sodium permanganate.

A residual film of varying thicknesses may be formed on the partially cured halogenated polyimide surface during the aforementioned oxidizing step. This film is formed in all the instances except when hydrogen peroxide or cerium sulfate is used as the oxidizing agent. The film may remain on the surface of the partially cured halogenated polyimide layer even after rinsing. Such a film may be removed by contacting the surface with a mild reducing agent such as an aqueous solution of about 1% to about 10% by weight of stannous chloride in about 5% by weight of hydrochloric acid, an aqueous solution of about 10% to about 30% by weight of hydrogen peroxide in about 5% by weight of sulfuric acid or ammonium hydroxide, Shipley Circuposit ® MLB neutralizer 216, an aqueous solution of about 1% to about 30% by weight of sodium bisulfite in about 5% by weight of sulfuric acid or an aqueous solution of about 1% to about 10% by weight of hydroxylamine hydrochloride at a temperature of about 50° C. Preferably the film is contacted with Shipley Circuposit ® MLB neutralizer 216 bath maintained at about 48° C. to about 50° C. for about 4 minutes. The mild reducing agents disclosed in U.S. Pat. No. 4,515,829 to Deckert et al. are incorporated herein by reference. The aforementioned reducing agents are strong enough to dissolve $MnO_2$ film but are mild enough to have little effect on the makeup of the cleaned and oxidized partially cured halogenated polyimide surface.

During the oxidizing step the molecules disposed along the surface are oxidized. The presence of oxidized molecules along the partially cured halogenated polyimide surface has been confirmed by chemical element analysis. The surface was chemically analyzed to a depth of 50 Å by means of X-ray photoelectron spectroscopy. It was determined that, 1) there was increased in oxygen level,
2) some of the carbon backbone (C—C, C═C, C—H) functionalities were oxidized, and
3) that there was increase in C—O— functionality.

As used hereinabove "effective time, temperature and concentration" relate to a period of duration, degrees of temperature and concentration respectively required to achieve a sufficient level of oxidizing necessary to produce a desired result on the surface and those skilled in the art will readily realize that by manipulating the concentrations and the temperatures of the various aforementioned reagents used in the present invention, the time of contact may be optimized for particular processing conditions. For example a partially cured halogenated polyimide surface in the form of an EMI enclosure may be contacted for cosmetic reasons on the inner or hidden walls or surfaces of the enclosure. The aforementioned methods of contacting the surface with the reagents are well known in the art.

Activation of the partially cured halogenated polyimide layer for plating purposes can be achieved by well known methods of the art. For example, the layer may be contacted with an acid solution of a precious metal, such as palladium chloride in hydrochloric acid, for a period of time sufficient to cause catalytic activation of the layer surface. Activation and plating processes suitable for the present invention are described in W. T. Grubb et al, European No. EP 272,420, incorporated herein by reference, as well as in U.S. Pat. Nos. 3,011,920 and 3,841,881, issued to Shipley and Feldstein et al, respectively, both of which are also incorporated herein by reference. A water rinse generally follows the activation step.

After surface activation and rinsing, electroless plating can be undertaken. Illustrative metals used to form an electrolessly deposited first metal layer, also disclosed as a primary metal layer, on the activated surface of the partially cured halogenated polyimide layer include, copper and nickel. Nickel is preferred. The primary layer is provided with a thickness sufficiently thin to allow removal of any moisture and any residual NMP solvent present on the underlying surface of the partially cured polyimide layer during a final cure step, described hereinafter; a thickness of about 0.25 to about 2 microns, preferably about 1 micron is generally provided. Electroless baths are well-known in the art and are generally described in the *Kirk-Othmer Enclyclopedia of Chemical Technology*, 3rd Edition, Volume 8, the contents of which are incorporated herein by reference.

After the deposition of the primary metal layer, the partially cured halogenated polyimide layer is final cured into a halogenated polyimide layer. Oven heating of the entire article, i.e., substrate with the primary metal layer thereon, is sufficient, although any heating method is suitable. The final cure step is preferably carried out under an inert atmosphere provided by a gas, such as nitrogen, helium and argon. Nitrogen is preferred. The final cure temperature at which the imidization is carried out depends upon the metal that was electrolessly deposited. For example, the final cure temperature for a partially cured polyimide layer having an electrolessly deposited copper layer thereon varies from about 110° C. to about 200° C., preferably about 175° C. The duration for the final cure step for the aforementioned combination varies from about 2 to about 48 hours, preferably about 8 hours. The final cure temperature for a partially cured polyimide layer having an electrolessly deposited nickel layer thereon varies from about 287° C. to about 357° C., preferably about 330° C. Typically, the final cure step for the aforementioned combination is carried out for about 15 minutes to about 8 hours, preferably for about 2 hours. It would be apparent to one skilled in the art to know that the higher temperatures within the above range generally compensate for shorter duration, and vice versa. It is believed that during this final curing stage in excess of about 99.5% of the halogenated polyamic acid is imidized. Additionally, an increase in the molecular weight of the polyimide occurs after the final cure step.

It has been determined that by deposition of an electroless layer on a partially cured polyimide layer, followed by a final cure step, a significant increase in adhesion values with respect to the metal layer deposited thereon is seen. Although the mechanism is not fully understood, it is believed that a partially cured polyimide layer contains amine and carboxylic acid functional groups and during the final cure step, the metal molecules from the electrolessly deposited layer react with either the amine, the carboxylic acid, or both functional groups to produce a strong metal-to-polyimide bond, which significantly contributes to higher observed adhesion values. The presence of the aforementioned amine and carboxylic acid functional groups within the surface thickness of about 5,000 Å was confirmed by the attenuated total reflectance infrared spectroscopic studies (ATR) performed by a Fourier transform infrared spectrophotometer, Model No. 7199, made by Nicolet Instrument Corporation, Madison, Wis.

A second metal layer, also disclosed as a secondary metal layer, is then applied on the primary metal layer after the final cure step. Though electroless plating is the preferred application method for a second metal layer electroplating may be also used. Electroplating baths are well-known in the art and are described, for example, in U.S. Pat. No. 4,555,315, incorporated herein by reference, although the particular electroplating bath used is not critical to the present invention. The choice of course depends in part on the particular metal being deposited. Illustrative metals used to form the second metal layer include copper, palladium, nickel, cobalt, gold, and various combinations thereof. The term "combinations" is defined to mean multiple layers of various metals deposited on the halogenated polyimide surface in any desired order. A description of baths for plating copper or various other metals is given in the Kirk-Othmer reference described above, in Vol. 8, beginning on page 826. The thickness of this second metal layer will of course depend upon the desired end use of the metal-coated substrate.

A heat treatment may be utilized at this stage. A typical heating regimen would be about 15 minutes to about 20 hours at about 45° C. to about 120° C.

A smooth surface can be achieved by the deposition of a second electrolytic layer, which contains chemical additives, on top of the first electrolytic layer. The bath used to apply this layer is sometimes referred to herein as an "additive" bath.

After deposition of the second electrolytic layer, the substrate is rinsed again with water and then heat treated to further enhance adhesion of the metal layers to the substrate. A typical heat treatment for this step, as stated earlier, can involve temperatures ranging from about 45° C. to about 120° C. for a time period ranging from about 15 minutes to about 20 hours.

The result of the second electrolytic deposition can be a smooth, bright metal layer characterized by a high level of adhesion of the halogenated polyimide substrate.

In preferred embodiments, an article prepared by the method of this invention usually has a first electrolessly applied metal layer which is about 0.25 micron to about 2 microns thick, preferably about 1 micron thick; a second electrolessly applied metal layer of at least about 5 microns; and a third, if so desired, electrolessly applied metal layer having a thickness of at least about 5 microns. However it should be noted that the present invention contemplates multiple layers of different metals and it should not be construed that the invention is restricted to just three or less metal layers.

An article prepared by the method of this invention comprises a halogenated polyimide surface having oxidized halogenated polyimide molecules disposed thereon and metal disposed on such surface. The metal layer comprises an electrolessly applied primary layer on the surface of a partially cured polyimide surface and any additional electrolessly or electrolytically applied secondary metal layers of desired thickness on top of the primary metal layer applied after the final curing of the partially cured polyimide layer into the polyimide layer. The present invention contemplates various combinations of metal layers such as a single copper layer, a primary copper layer followed by a secondary nickel layer or a primary nickel layer followed by a secondary copper layer and a tertiary nickel layer.

Articles of various embodiments prepared by the method of this invention are an insulated mold surface, an EMI shielded enclosures and polyimide coated optic fibers. The surfaces of the aforementioned articles have metallic layers deposited by a method disclosed herein.

An article of manufacture of the preferred embodiment is an insulated mold surface having halogenated polyimide surfaces chemically treated by the process of the present invention to improve electroless deposition of a first metal layer, preferably of nickel, thereon. Generally, the thickness of the halogenated polyimide layer, disposed on cores and/or cavities of a mold, typically made of steel, copper or aluminum is about 150 to about 500 microns, preferably about 250 microns. The first metal layer is preferably provided with about 1 micron thickness. A second metal layer of copper, preferably having thickness of about 1 to 2 microns, is disposed on top of the first metal layer, the second layer being electrolessly or electrolytically applied on the first layer. As stated earlier, the second layer is preferably deposited by electroless metal deposition. A third metal layer of nickel, preferably having thickness of about 5 to 100 microns, may be disposed on top of the second metal layer, the third metal layer being electrolessly or electrolytically applied on the second layer.

Another article of manufacture of the present invention is an article, such as an EMI shielded enclosure, having halogenated polyimide surfaces chemically treated by the process of the present invention to improve electroless deposition of a first metal layer, preferably copper, thereon. Generally, the thickness of the halogenated polyimide layer, disposed on the sides of the walls of the EMI enclosure, is about 10 to about 50 microns, preferably about 25 microns. A second metal layer preferably of nickel is disposed on top of the first metal layer, the second metal layer being electrolessly or electrolytically applied on top of the first metal layer. As stated earlier, the second layer is preferably deposited by electroless metal deposition. Both the metal layers may be disposed, if so desired, on the interior sides of the walls of the enclosure. The combined thickness of the metal layers is adjusted to meet the desired requirements.

Another embodiment of the present invention is an article, such as an EMI shielded enclosure, having three metal layered EMI shields. Preferably the first layer is an electrolessly applied first nickel layer on the surfaces of the walls of the enclosure, the second layer is an electrolessly applied or electrolytically applied copper disposed on top of the first nickel layer and the third layer is an electrolessly applied or electrolytically applied second nickel layer disposed on top of the second layer.

In the examples to follow, adhesion of the metal to the substrate was evaluated by applying IPC-TM-650, Method 2.4.8.1 Peel test, issued by the Institute for Interconnecting and Packaging Electronic Circuits. Adhesion is generally measured as "peel strength", i.e. a force required to peel an adherent metal layer from an underlying substrate under controlled conditions. According to the aforementioned Peel Test, adhesion of the metal to the substrate is evaluated by measuring the force, in pounds per inch, necessary to peel 1/8th inch strips of the metal from the substrate surface. In the test, the 1/8th inch strips were prepared by a patterning technique using nitric acid as an etchant. The end of each metal strip was clipped to an AMETEK ® digital force measuring gage connected to a computer processor. The force values to lift the metal strips from the halogenated polyimide substrate were converted by the computer to pounds per inch peel values. Multiple peel values were obtained and then averaged for each plaque.

EXAMPLE

The surfaces of four stainless steel plaque samples were lightly abraded by grit blasting with 60 grit alumina, washed with water to remove debris, dried, heated to 109° C., and spray coated with a 254 µm thick coating of L-30N EYMYD ® fluorinated polyamic acid resin using a 6% by weight solution of L-30N resin dissolved in a solvent mixture comprising 20% by volume of dry N-methyl,2-pyrrolidone (NMP) intermixed with dry methylethylketone (MEK). All of the coated samples were then heated in an oven to a temperature of 241° C. for 2 hrs to volatilize NMP and to partially cure the polyamic acid resin coating into a partially cured polyimide layer on the surface of the steel plates. Samples 1 and 2 were then removed from the oven and samples 3 and 4 were final cured into a polyimide layer by ramping the oven temperature to 315° C. and then maintaining the oven temperature at 315° C. for 2 hours. All of the samples were lightly roughened by glass beading under a low blast pressure and then coated with a 2.5 µm layer of electroless nickel using the preplating and plating conditions shown below in Table 1:

TABLE 1

| Step | Procedure | Time (minutes) |
|---|---|---|
| 1 | clean in Micro solution | 30 |
| 2 | water rinse | 6 |
| 3 | Shipley Circuposit ® 213 Oxidizer | 15 |
| 4 | water rinse | 4 |
| 5 | Shipley Circuposit ® 216 Neutralizer | 4 |
| 6 | water rinse | 4 |
| 7 | Shipley Cataprep ® 404 catalyst preparation | 1 |
| 8 | Shipley Cataprep ® 44 catalyst solution | 5 |
| 9 | water rinse | 4 |
| 10 | Shipley Catalyst ® Accelerator 19 | 5 |
| 11 | water rinse | 4 |
| 12 | Enthone Enplate ® EN426 electroless Ni to 2.5 µm | 10 |
| 13 | water rinse | 4 |
| 14 | dry at 107° C. | 120 |

Following the aforementioned electroless nickel plating, sample 1, which had been partially cured at 241° C. and sample 3, which had been final cured at 315° C. were placed in an oven whose temperature was ramped to 315° C. in 2 hours and then maintained at that temperature for 2 hours. All of the samples were then electroplated with a 4 μm thick layer of electrolytic copper and then heated overnight in an oven at 107° C. Adhesion values as pounds of force per inch width of peel strip (lbs/in) are given below in Table 2 for these four samples.

TABLE 2

| Sample No. | Initial Cure Temp °C. | Final Cure Temp °C. | Final Cure State | Adhesion (lbs/in) |
|---|---|---|---|---|
| Partially Cured | | | | |
| 1 | 241 | 315 | complete | 9.6 |
| 2 | 241 | none | partial | 0.9 |
| Fully Cured | | | | |
| 3 | 315 | 315 | complete | 3.6 |
| 4 | 315 | none | complete | 3.6 |

From the results shown in Table 2, it can be ascertained that sample 1, which had been metallized according to the steps of the present invention, exhibits significantly higher adhesion values compared to Sample 3, which had been metallized according to a conventional method.

What is claimed is:

1. A method of metallizing a halogenated polyimide layer comprising:
   applying a coating of a halogenated polyamic acid over the surface of a substrate;
   partially curing said coating at a temperature in the range of 205°-250° C. into a partially cured halogenated polyimide layer;
   treating the surface of said partially cured halogenated polyimide layer with a degreasing agent;
   treating said degreased surface with an oxidizing agent;
   applying a primary electroless copper or nickel layer on said oxidized surface;
   curing said partially cured halogenated polyimide layer into said halogenated polyimide layer in a final curing step after application of said electroless layer; and
   applying a secondary metal layer on said primary metal layer after said final curing step.

2. The method of claim 1 further comprising contacting said surface after said oxidation step with a mild reducing agent for a time sufficient to remove most of the oxidized residue produced during said oxidation of said surface.

3. The method of claim 2 wherein said reducing agent is an aqueous solution of stannous chloride and hydrochloric acid, of hydrogen peroxide and sulfuric acid or ammonium hydroxide, of sodium bisulfite and sulfuric acid, or of hydroxylamine hydrochloride.

4. The method of claim 1 wherein said oxidizing agent is an aqueous solution of alkali metal permanganate and alkali metal hydroxide, of alkali metal dichromate and sulfuric acid, of ammonium dichromate and sulfuric acid, of cerium bisulfate and sulfuric acid, of chromium trioxide and sulfuric acid, or of hydrogen peroxide.

5. The method of claim 1 wherein said halogenated polyamic acid comprises the following structure:

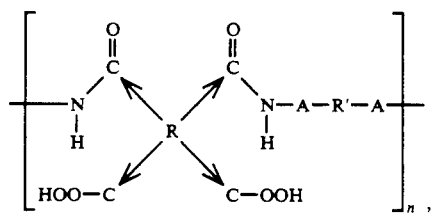

where R' is a halogenated alkyl group, A is a substituted or unsubstituted phenylene or diphenyl ether group, and R is an organic group of 5 to 50 carbon atoms.

6. The method of claim 5 wherein said organic group is selected from the group consisting of an unsubstituted aliphatic, halogen substituted aliphatic, alicyclic, aromatic, heteroaliphatic, heteroalicyclic, heteroaromatic radical and combinations thereof.

7. The method of claim 5 wherein R is at least one benzene or at least one fused polynuclear ring.

8. The method of claim 5 wherein said halogenated alkyl group is fluorinated.

9. The method of claim 1 wherein said halogenated polyamic acid precursor comprises the following structure:

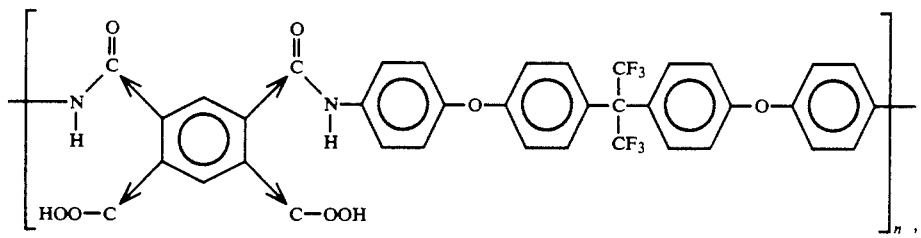

where n is an integer sufficient to provide a structure having an average molecular weight of at least 5000.

10. The method of claim 1 wherein said halogenated polyamic acid precursor comprises the following structure:

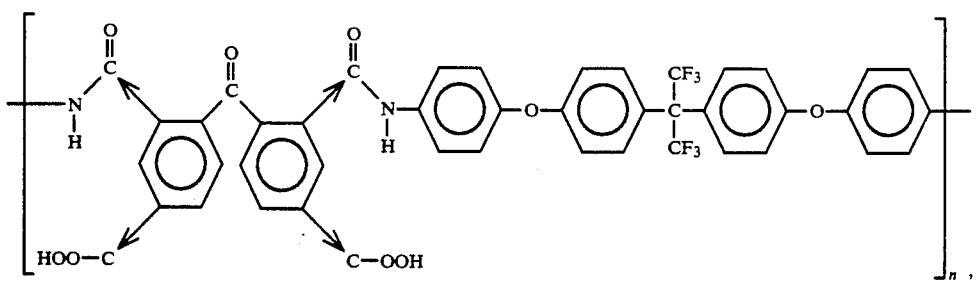

where n is an integer sufficient to provide a structure having an average molecular weight of at least 5000.

11. The method of claim 1 wherein said secondary metal layer comprises:
an electrolessly or electrolytically applied metal layer of copper, nickel, gold, silver, platinum, palladium, cobalt or combinations thereof.

12. The method of claim 1 wherein said final curing step is conducted in an inert atmosphere.

13. The method of claim 12 wherein said inert atmosphere comprises nitrogen, helium or argon.

14. The method of claim 1 said step of applying said coating further comprises spraying a solution of said halogenated polyamic acid on said surface of said substrate heated to about 207° C. to 246° C.

15. The method of claim 1 wherein said partial curing step comprises heating said coating at about 207° C. to 246° C. for about 30 minutes to about 2 hours.

16. A method of metallizing a halogenated polyimide layer comprising:
applying a coating of a halogenated polyamic acid over the surface of a substrate heated to about 207° C. to 246° C.;
partially curing said coating at a temperature in the range of 205°-250° C. into a partially cured halogenated polyimide layer;
treating the surface of said partially cured halogenated polyimide layer with a degreasing agent;
treating said degreased surface with an oxidizing agent;
contacting said oxidized surface with a mild reducing agent for a time sufficient to remove most of the oxidized residue produced during said oxidation of said surface;
applying a primary electroless copper or nickel layer on said oxidized surface;
curing said partially cured halogenated polyimide layer into said halogenated polyimide layer in a final curing step under an inert atmosphere after application of said electroless layer; and
electrolessly or electrolytically applying a secondary metal layer on top of said primary metal layer after said final curing step.

17. The method of claim 16 wherein said secondary metal layer comprises copper, nickel, gold, silver, platinum, palladium, cobalt or combinations thereof.

18. The method of claim 16 wherein said halogenated polyimide layer is heat treated after applying said secondary metal layer on said primary layer at a temperature of about 45° C. to about 120° C. for about 15 minutes to about 20 hours.

19. The method of claim 16 wherein said oxidizing agent comprises an aqueous solution of about 3 to about 5 grams per liter of potassium permanganate and about 5 to about 10 grams per liter of sodium hydroxide.

20. The method of claim 16 wherein said mild reducing agent is hydroxylamine hydrochloride.

* * * * *